(12) United States Patent
Okada et al.

(10) Patent No.: US 6,551,723 B1
(45) Date of Patent: Apr. 22, 2003

(54) ORGANIC ELECTROLUMINESCENCE ELEMENT MATERIAL AND ORGANIC ELECTROLUMINESCENCE ELEMENT COMPRISING SAME

(75) Inventors: Hisashi Okada, Minami-Ashigara (JP); Tatsuya Igarashi, Minami-Ashigara (JP); Toshiki Taguchi, Minami-Ashigara (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/376,347

(22) Filed: Aug. 18, 1999

(30) Foreign Application Priority Data

Aug. 18, 1998 (JP) ............................................. 10-231851

(51) Int. Cl.⁷ ............................................... H05B 33/14
(52) U.S. Cl. ....................... 428/690; 428/917; 428/704; 313/504; 313/506
(58) Field of Search ................................ 548/416, 452, 548/453; 428/690, 917, 704; 313/504, 506

(56) References Cited

U.S. PATENT DOCUMENTS 5,326,681 A * 7/1994 Sato et al. .................. 430/558
5,443,922 A * 8/1995 Nishizaki et al.
5,672,466 A * 9/1997 Okamura et al. ........... 430/336

FOREIGN PATENT DOCUMENTS

| JP | 6-220438 | * | 8/1994 | |
| JP | 9-188875 | | 7/1997 | |
| JP | 11-121177 | * | 4/1999 | ........... H05B/33/22 |

OTHER PUBLICATIONS

Flitsch et al. (Tetrahedron Letters, vol. 30, No. 13, pp 1633–1636, 1989), No month.*

* cited by examiner

*Primary Examiner*—Deborah Jones
*Assistant Examiner*—Ling Xu
(74) *Attorney, Agent, or Firm*—Sughrue Mion, PLLC

(57) ABSTRACT

The present invention provides an organic EL element material which can emit light having a high color purity at a low driving voltage, a high luminescence and a high efficiency and exhibits an excellent stability in repeated use. A normal organic electroluminescence element material is provided which is a heterocyclic compound produced by the condensation of a 5- or 6-membered ring with a 5- to 7-membered ring.

14 Claims, No Drawings

ORGANIC ELECTROLUMINESCENCE ELEMENT MATERIAL AND ORGANIC ELECTROLUMINESCENCE ELEMENT COMPRISING SAME

FIELD OF THE INVENTION

The present invention relates to a light-emitting element (e.g., organic electroluminescence (EL) element) material, which can convert electric energy to light to emit light and a light-emitting (luminescent) element comprising such a light-emitting element material. More particularly, the present invention relates to a light-emitting element which can be used in the art of display element, display, back light, electrophotography, illuminant, sign-board, interior, etc.

BACKGROUND OF THE INVENTION

The research and development of various display elements are now under way. Among these display elements, organic EL elements can emit light having a high luminescence at a low voltage and thus have been considered to be favorable display elements. For example, an EL element having an organic thin film formed by evaporation of an organic compound has been known (Applied Physics Letters, vol. 51, page 913, 1987). The organic EL element proposed has a laminated structure comprising an electron transporting material and a positive hole transporting material and hence exhibits drastically improved light-emitting properties as compared with the conventional single-layer type elements.

As a means for enhancing the percent emission of the foregoing laminated EL elements there has been known a process involving doping with a fluorescent dye. For example, an organic EL element doped with a coumarin dye described in "Journal of Applied Physics", vol. 65, page 3,610, 1989 exhibits a drastically enhanced percent emission as compared with elements free of the dye. The organic EL element proposed can emit light having a desired wavelength by changing the kind of the fluorescent compound used. However, there are few compounds which can emit blue light at a high efficiency and exhibits an excellent durability.

As blue light-emitting materials for organic EL elements there have been disclosed condensed polycyclic aromatic compounds such as anthracene, pyrene and perylene (as disclosed in J. Chem. Phys., 44, 2902 (1966), Thin. Solid. Films, 99, 171 (1982)), tetraphenylbutadiene compounds (as disclosed in JP-A-59-194393 (The term "JP-A" as used herein means an "unexamined published Japanese patent application")), distyrylbenzene compounds (as disclosed in EP 4,672,265, EP 3,198,881, EP 3,735,582, U.S. Pat. Nos. 4,672,265, 4,725,531, 4,734,338, 4,741,976, 4,776,320, JP-A-61-37890, JP-A-1-245087, JP-A-2-247277, JP-A-2-247278, JP-A-2-209988, JP-A-3-33184, JP-A-3-84089, JP-A-3-231970, JP-A-4-117485, JP-A-4-275268, JP-A-5-17765, JP-A-5-140145), stilbene compounds (as disclosed in JP-A-2-235983, JP-A-3-47890, etc.), polyphenyl compounds (as disclosed in JP-A-3-33183), polycarbonate compounds having aromatic tertiary amine skeleton as a repeating unit (as disclosed in JP-A-5-247459), metal complexes having tropolone skeleton (as disclosed in JP-A-9-157642), and metal complexes having 2-(o-hydroxyphenyl)-benzoxazole derivative or 2-(o-hydroxyphenyl)-benzthiazole derivative as a ligand (as disclosed in JP-A-7-133483, JP-A-8-113576, JP-A-8-301877, JP-A-8-306489). However, these compounds are disadvantageous in that they exhibit a low percent emission or a deteriorated durability or color purity. Thus, these compounds cannot be put into practical use.

As electron transporting materials for organic EL elements there have been used 1, 3, 4-oxadiazole derivatives, tris (8-hydroxyquinolinate) aluminum, etc. The former material is disadvantageous in that it operates at a high driving voltage and exhibits a deteriorated durability. The latter material is disadvantageous in that it can hardly act as an electron transporting material for emission of blue light. It has thus been desired to develop an electron transporting material effective for emission of blue light.

On the other hand, an organic EL element which realizes emission of light having a high luminescence is an element having a laminate of vacuum-evaporated organic materials. Such an organic EL element is preferably prepared by coating process from the standpoint of simplification of production process, workability, increase of surface area of element, etc. However, elements prepared by the conventional coating process are inferior to elements prepared by evaporation process in luminescence and percent emission. Thus, it has been desired to enhance the luminescence and percent emission of these elements.

SUMMARY OF THE INVENTION

It is therefore an object of the present invention to provide an organic EL element material which can emit light having a high color purity at a low driving voltage, a high luminescence and a high efficiency and exhibits an excellent stability in repeated use.

The foregoing object of the present invention will become more apparent from the following detailed description and examples.

The foregoing object of the present invention can be accomplished by the following constitutions:

(1) An organic electroluminescence element material which is a heterocyclic compound in which a 5- or 6-membered ring is condensed with a 5- to 7-membered ring.

(2) An organic electroluminescence element material which is a heterocyclic compound in which a 5-membered ring is condensed with a 5-membered ring.

(3) An organic electroluminescence element material which is a heterocyclic compound in which a 5-membered ring is condensed with a 6-membered ring.

(4) An organic electroluminescence element material which is a nitrogen-containing heterocyclic compound in which 5-membered ring is condensed with a 5-membered ring.

(5) An organic electroluminescence element material which is a nitrogen-containing heterocyclic compound in which a 5-membered ring is condensed with a 6-membered ring.

(6) An organic electroluminescence element material which is a nitrogen-containing heterocyclic compound in which a 5-membered ring is condensed with a 5-membered ring, and the nitrogen-containing heterocyclic compound has a nitrogen atom at the condensation position.

(7) An organic electroluminescence element material which is a nitrogen-containing heterocyclic compound in which a 5-membered ring is condensed with a 6-membered ring, and the nitrogen-containing heterocyclic compound has a nitrogen atom at the condensation position.

(8) An organic electroluminescence element material which is a compound represented by the following formula (I):

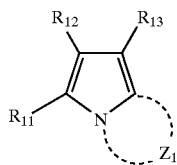

(I)

wherein $R_{11}$, $R_{12}$ and $R_{13}$ each independently represents a hydrogen atom or substituent; and $Z_1$ represents an atomic group required to form a 5- or 6-membered ring.

(9) An organic electroluminescence element material which is a compound represented by the following formula (II):

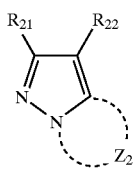

(II)

wherein $R_{21}$ and $R_{22}$ each independently represents a hydrogen atom or substituent; and $Z_2$ represents an atomic group required to form a 5- or 6-membered ring.

(10) An organic electroluminescence element material which is a compound represented by the following formula (III):

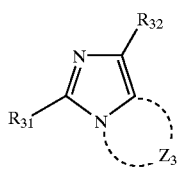

(III)

wherein $R_{31}$ and $R_{32}$ each independently represents a hydrogen atom or substituent; and $Z_3$ represents an atomic group required to form a 5- or 6-membered ring.

(11) An organic electroluminescence element material which is a compound represented by the following formula (IV):

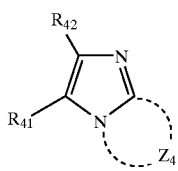

(IV)

wherein $R_{41}$ and $R_{42}$ each independently represents a hydrogen atom or substituent; and $Z_4$ represents an atomic group required to form a 5- or 6-membered ring.

(12) An organic electroluminescence element material which is a compound represented by the following formula (V):

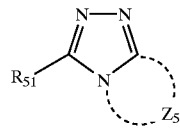

(V)

wherein $R_{51}$ represents a hydrogen atom or substituent; and $Z_5$ represents an atomic group required to form a 5- or 6-membered ring.

(13) An organic electroluminescence element material which is a compound represented by the following formula (VI):

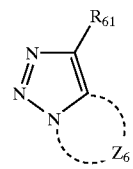

(VI)

wherein $R_{61}$ represents a hydrogen atom or substituent; and $Z_6$ represents an atomic group required to form a 5- or 6-membered ring.

(14) An organic electroluminescence element material which is a compound represented by the following formula (VII):

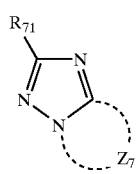

(VII)

wherein $R_{71}$ represents a hydrogen atom or substituent; and $Z_7$ represents an atomic group required to form a 5- or 6-membered ring.

(15) An organic electroluminescence element material which is a metal complex made of a compound represented by any one of the formulae (I) to (VII) according to Clauses (8) to (14) and metal ions.

(16) An organic electroluminescence element comprising a light-emitting layer or a plurality of organic compound thin layers containing light-emitting layer formed between a pair of electrodes, characterized in that at least one of said organic compound thin layers is one containing an organic electroluminescence element material defined in any one of Clauses (1) to (15).

(17) An organic electroluminescence element comprising a light-emitting layer or a plurality of organic compound thin layers containing light-emitting layer formed between a pair of electrodes, characterized in that at least one of said organic compound thin layers is one comprising an organic electroluminescence element material defined in any one of Clauses (1) to (15) dispersed in a polymer.

DETAILED DESCRIPTION OF THE INVENTION

The heterocyclic compound produced by the condensation of 5- or 6-membered rings with 5- to 7-membered rings of the present invention will be further described hereinafter.

The heterocyclic compound produced by the condensation of a 5- or 6-membered ring with a 5- to 7-membered ring of the present invention is a product of condensation of two or more, preferably from 2 to 6, more preferably from 2 to 3, particularly two rings. Hetero atoms can be contained in any one of condensed rings. It is preferred that hetero atoms be contained in two or more of condensed rings. Preferred examples of hetero atoms include nitrogen atom, oxygen atom, and sulfur atom. Even more preferred among these hetero atoms are nitrogen atom and oxygen atom. Particularly preferred among these hetero atoms is nitrogen atom.

Specific examples of rings constituting the condensed ring include furane, thiophene, pyran, pyrrole, imidazole, pyrazole, pyridine, pyrazine, pyrimidine, pyridazine, thiazole, oxazole, isothiazole, isoxazole, thiadiazole, oxadiazole, triazole, pyrroline, imidazoline, pyrazoline, and triazine. Preferred among these rings are pyrrole, imidazole, pyrazole, pyridine, pyrazine, pyrimidine, pyridazine, thiazole, oxazole, isothiazole, isoxazole, and triazole. Even more preferred among these rings are pyrrole, imidazole, pyrazole, pyridine, pyrazine, pyrimidine, pyridazine, and triazole.

Preferred examples of the condensed ring include those produced by the condensation of 5-membered rings and those produced by the condensation of 5-membered ring with 6-membered ring. Even more preferred among these heterocyclic rings are those produced by the condensation of 5-membered rings having nitrogen atom and those produced by the condensation of 5-membered ring having nitrogen atom with 6-membered ring having nitrogen atom. Particularly preferred among these heterocyclic rings are those produced by the condensation of 5-membered rings having nitrogen atom at the condensation position and those produced by the condensation of 5-membered ring having nitrogen atom at the condensation position with 6-membered ring having nitrogen atom at the condensation position.

Specific examples of the condensed ring include indolizine, indazole, purine, quinolidine, phthalazine, naphthyridine, quinoxaline, quinazoline, cinnoline, pteridine, carboline, phenazine, pyrroloimidazole, pyrazolotriazole, pyrazolopyrimidine, pyrazolotriazine, imidazoimidazole, imidazopyridazine, triazopyridine, and tetrazaindene. Even more preferred among these condensed rings are pyrroloimidazole, pyrrolotriazole, pyrazoloimidazole, pyrazolotriazole, and tetrazaindene. Particularly preferred among these condensed rings are pyrrolotriazole, and pyrazolotriazole.

In the present specification, Cn–m represents a group having n to m carbon atoms.

The foregoing condensed rings may have substituents. Examples of these substituents include alkyl group (preferably $C_{1-20}$, more preferably $C_{1-12}$, particularly $C_{1-8}$ alkyl group, e.g., methyl, ethyl, iso-propyl, tert-butyl, n-octyl, n-decyl, n-hexadecyl, cyclopropyl, cyclopentyl, cyclohexyl), alkenyl group (preferably $C_{2-20}$, more preferably $C_{2-12}$, particularly $C_{2-8}$ alkenyl group, e.g., vinyl, allyl, 2-butenyl, 3-pentenyl), alkinyl group (preferably $C_{2-20}$, more preferably $C_{2-12}$, particularly $C_{2-8}$ alkinyl group, e.g., propargyl, 3-pentinyl), aryl group (preferably $C_{6-30}$, more preferably $C_{6-20}$, particularly $C_{6-12}$ aryl group, e.g., phenyl, p-methylphenyl, naphthyl), amino group (preferably $C_{0-20}$, more preferably $C_{0-10}$, particularly $C_{0-6}$ amino group, e.g., amino, methylamino, dimethylamino, diethylamino, dibenzylamino), alkoxy group (preferably $C_{1-20}$, more preferably $C_{1-12}$, particularly $C_{1-8}$ alkoxy group, e.g., methoxy, ethoxy, butoxy), aryloxy group (preferably $C_{6-20}$, more preferably $C_{6-16}$, particularly $C_{6-12}$ aryloxy group, e.g., phenyloxy, 2-naphthyloxy), acyl group (preferably $C_{1-20}$, more preferably $C_{1-6}$, particularly $C_{1-12}$ acyl group, e.g., acetyl, benzoyl, formyl, pivaloyl), alkoxycarbonyl group (preferably $C_{2-20}$, more preferably $C_{2-16}$, particularly $C_{2-12}$ alkoxycarbonyl group, e.g., methoxycarbonyl, ethoxycarbonyl), aryloxycarbonyl group (preferably $C_{7-20}$, more preferably $C_{7-16}$, particularly $C_{7-10}$ aryloxycarbonyl group, e.g., phenyloxycarbonyl), acyloxy group (preferably $C_{2-20}$, more preferably $C_{2-16}$, particularly $C_{2-10}$ acyloxy group, e.g., acetoxy, benzoyloxy), acylamino group (preferably $C_{2-20}$, more preferably $C_{2-16}$, particularly $C_{2-10}$ acylamino group, e.g., acetylamino, benzoylamino), alkoxycarbonylamino group (preferably $C_{2-20}$, more preferably $C_{2-16}$, particularly $C_{2-12}$ alkoxycarbonylamino group, e.g., methoxycarbonylamino), aryloxycarbonylamino group (preferably $C7_{7-20}$, more preferably $C_{7-16}$, particularly $C_{7-12}$ aryloxycarbonyl amino group, e.g., phenyloxycarbonylamino), sulfonylamino group (preferably $C_{1-20}$, more preferably $C_{1-6}$, particularly $C_{1-2}$ sulfonylamino group, e.g., methanesulfonylamino, benzenesulfonylamino), sulfamoyl group (preferably $C_{0-20}$, more preferably $C_{0-16}$, particularly $C_{0-12}$ sulfamoyl group, e.g., sulfamoyl, methylsulfamoyl, dimethylsulfamoyl, phenylsulfamoyl), carbamoyl group (preferably $C_{1-20}$, more preferably $C_{1-16}$, particularly $C_{1-12}$ carbamoyl group, e.g., carbamoyl, methylcarbamoyl, diethylcarbamoyl, phenylcarbamoyl), alkylthio group (preferably $C_{1-20}$, more preferably $C_{1-16}$, particularly $C_{1-12}$ alkylthio group, e.g., methylthio, ethylthio), arylthio group (preferably $C_{6-20}$, more preferably $C_{6-16}$, particularly $C_{6-12}$ arylthio group, e.g., phenylthio), sulfonyl group (preferably $C_{1-20}$, more preferably $C_{1-16}$, particularly $C_{1-12}$ sulfonyl group, e.g., mesyl, tosyl), sulfinyl group (preferably $C_{1-20}$, more preferably $C_{1-16}$, particularly $C_{1-12}$ sulfinyl group, e.g., methanesulfinyl, benzenesulfinyl), ureide group (preferably $C_{1-20}$, more preferably $C_{1-16}$, particularly $C_{1-12}$ ureide group, e.g., ureide, methylureide, phenylureide), phosphoric acid amide group (preferably $C_{1-20}$, more preferably $C_{1-16}$, particularly $C_{1-12}$ phosphoric acid amide group, e.g., diethylphosphoric acid amide, phenylphosphoric acid amide), hydroxyl group, mercapto group, halogen atom (e.g., fluorine, chlorine, bromine, iodine), cyano group, sulfo group, carboxyl group, nitro group, hydroxamic acid group, sulfino group, hydrazino group, imino group, and heterocyclic group (preferably $C_{1-20}$, more preferably $C_{1-12}$ heterocyclic group having nitrogen atom, oxygen atom or sulfur atom as hetero atoms, e.g., imidazolyl, pyridyl, quinolyl, furyl, piperidyl, morpholino, benzoxazolyl, benzimidazolyl, benzthiazolyl). These substituents may be further substituted. If there are two or more substituents, they may be the same or different. If possible, these substituents may be connected to each other to form a ring.

Preferred among these substituents are alkyl group, alkenyl group, aralkyl group, aryl group, acyl group, alkoxyl group, aryloxy group, acyloxy group, alkoxycarbonyl group, aryloxycarbonyl group, carbonylamino group, sulfonylamino group, sulfamoyl group, carbamoyl group, cyano group, halogen atom, hydroxyl group, and heterocyclic group. Even more preferred among these substituents are alkyl group, alkenyl group, aralkyl group, aryl group, acyl group, alkoxycarbonyl group, carbonylamino group, sulfonylamino group, cyano group, halogen atom, and aromatic heterocyclic group. Particularly preferred among these substituents are alkyl group, alkenyl group, aryl group, alkoxycarbonyl group, cyano group, and aromatic azole group.

Preferred examples of the condensed group are compounds represented by the following formulae (I) to (VII):

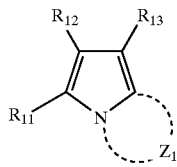
(I)

wherein $R_{11}$, $R_{12}$ and $R_{13}$ each independently represents a hydrogen atom or substituent; and $Z_1$ represents an atomic group required to form a 5- or 6-membered ring.

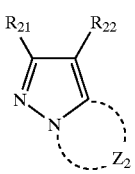
(II)

wherein $R_{21}$ and $R_{22}$ each independently represents a hydrogen atom or substituent; and $Z_2$ represents an atomic group required to form a 5- or 6-membered ring.

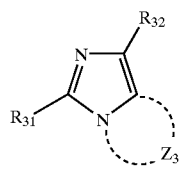
(III)

wherein $R_{31}$ and $R_{32}$ each independently represents a hydrogen atom or substituent; and $Z_3$ represents an atomic group required to form a 5- or 6-membered ring.

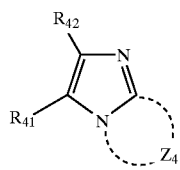
(IV)

wherein $R_{41}$ and $R_{42}$ each independently represents a hydrogen atom or substituent; and $Z_4$ represents an atomic group required to form a 5- or 6-membered ring.

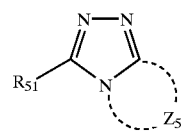
(V)

wherein $R_{51}$ represents a hydrogen atom or substituent; and $Z_5$ represents an atomic group required to form a 5- or 6-membered ring.

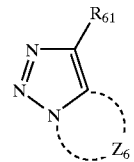
(VI)

wherein $R_{61}$ represents a hydrogen atom or substituent; and $Z_6$ represents an atomic group required to form a 5- or 6-membered ring.

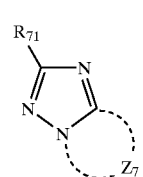
(VII)

wherein $R_{71}$ represents a hydrogen atom or substituent; and $Z_7$ represents an atomic group required to form a 5- or 6-membered ring.

The compounds represented by the foregoing formulae (I) to (VII) are in the form of canonical structure but may be in the form of tautomer.

Examples of the substituents represented by $R_{11}$, $R_{12}$, $R_{13}$, $R_{21}$, $R_{22}$, $R_{31}$, $R_{32}$, $R_{41}$, $R_{42}$, $R_{51}$, $R_{61}$ and $R_{71}$ include those described above with reference to condensed ring, including preferred examples thereof. If possible, the foregoing substituents may be connected to each other or to condensed rings to form a ring.

Examples of the 5- or 6-membered ring formed by $Z_1$ include pyrrole, pyrazole, imidazole, triazole, thiazole, thiadiazole, oxazole, oxadiazole, triazine, pyrimidine, pyridine, pyrazine, and pyridazine. Preferred among these rings are imidazole, triazole, triazine, and pyrimidine. Even more preferred among these rings are imidazole, triazole, and triazine. Particularly preferred among these rings is triazole.

Examples of the 5- or 6-membered ring formed by $Z_2$ include pyrrole, pyrazole, imidazole, triazole, thiazole, thiadiazole, oxazole, oxadiazole, triazine, pyrimidine, pyridine, pyrazine, and pyridazine. Preferred among these rings are imidazole, triazole, triazine, and pyrimidine. Even more preferred among these rings are imidazole, triazole, and triazine. Particularly preferred among these rings are imidazole and triazole.

Examples of the 5- or 6-membered ring formed by $Z_3$ include pyrrole, pyrazole, imidazole, triazole, thiazole, thiadiazole, oxazole, oxadiazole, triazine, pyrimidine, pyridine, pyrazine, and pyridazine. Preferred among these rings are pyrrole, pyrazole, imidazole, and triazole. Even more preferred among these rings are pyrrole, pyrazole, and triazole. Particularly preferred among these rings are pyrrole and pyrazole.

Examples of the 5- or 6-membered ring formed by $Z_4$ include pyrrole, pyrazole, imidazole, triazole, thiazole, thiadiazole, oxazole, oxadiazole, triazine, pyrimidine, pyridine, pyrazine, and pyridazine. Preferred among these rings are pyrrole, pyrazole, imidazole, and triazole. Even more preferred among these rings are pyrrole, pyrazole, and triazole. Particularly preferred among these rings are pyrrole and pyrazole.

Examples of the 5- or 6-membered ring formed by $Z_5$ include pyrrole, pyrazole, imidazole, thiazole, oxazole, triazine, pyrimidine, pyridine, pyrazine, and pyridazine. Preferred among these rings are pyrrole, pyrazole, imidazole, pyrimidine, pyrazine, and pyridazine. Even more preferred among these rings are pyrrole, pyrazole, pyrimidine, and pyridazine. Particularly preferred among these rings are pyrrole and pyrazole.

Examples of the 5- or 6-membered ring formed by $Z_6$ include pyrrole, imidazole, thiazole, oxazole, pyrimidine, pyridine, and pyridazine. Preferred among these rings are pyrrole, imidazole, pyrimidine, pyrazine, and pyridazine. Even more preferred among these rings are pyrrole, pyrimidine, pyrazine, and pyridazine. Particularly preferred among these rings are pyrrole and pyrimidine.

Examples of the 5- or 6-membered ring formed by $Z_7$ include pyrrole, imidazole, thiazole, oxazole, pyrimidine, pyridine, and pyridazine. Preferred among these rings are pyrrole, imidazole, pyrimidine, pyrazine, and pyridazine. Even more preferred among these rings are pyrrole, pyrimidine, pyrazine, and pyridazine. Particularly preferred among these rings are pyrrole and pyrimidine.

The 5- or 6-membered rings formed by $Z_1$ to $Z_7$ may have substituents. Examples of the substituents include those described above with reference to the foregoing condensed ring, including preferred examples thereof.

Preferred among the compounds represented by the foregoing formulae (I) to (VII) are those represented by the formulae (I), (II), (IV), (V) and (VII).

Preferred among the compounds represented by the formula (I) are those represented by the following formulae (I-a) to (I-f):

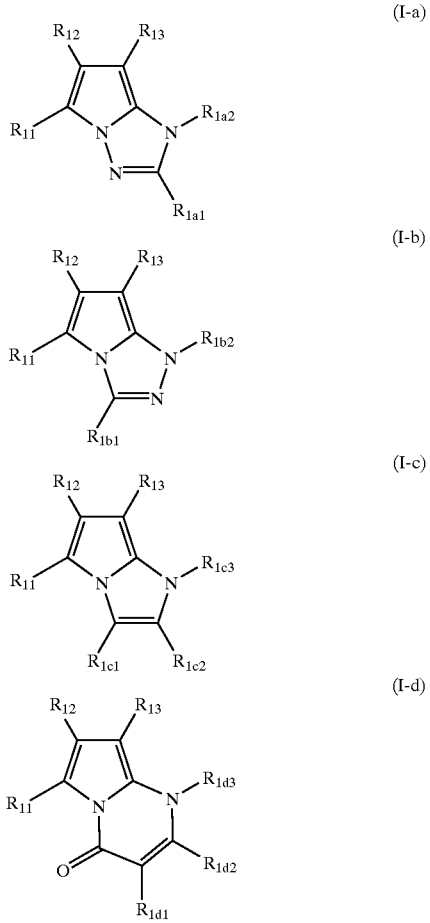

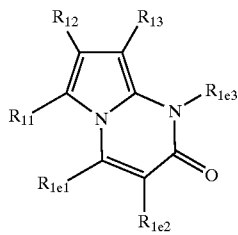

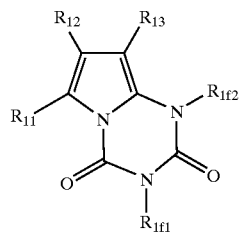

In the foregoing formulae (I-a) to (I-f), $R_{11}$, $R_{12}$, and $R_{13}$ are as defined in the formula (I), including preferred examples thereof. $R_{1a1}$, $R_{1a2}$, $R_{1b1}$, $R_{1b2}$, $R_{1c1}$, $R_{1c2}$, $R_{1c3}$, $R_{1d1}$, $R_{1d2}$, $R_{1d3}$, $R_{1e1}$, $R_{1e2}$, $R_{1e3}$, $R_{1f1}$ and $R_{1f2}$ each independently represents a hydrogen atom or substituent. Examples of the substituent represented by $R_{1a1}$, $R_{1b1}$, $R_{1c1}$, $R_{1c2}$, $R_{1d1}$, $R_{1d2}$, $R_{1e1}$ and $R_{1e2}$ include those represented by $R_{11}$, including preferred examples thereof. Examples of the substituent represented by $R_{1a2}$, $R_{1b2}$, $R_{1c3}$, $R_{1d3}$, $R_{1e3}$, $R_{1f1}$ and $R_{1f2}$ include alkyl group (preferably $C_{1-20}$, more preferably $C_{1-12}$, particularly $C_{1-8}$ alkyl group, e.g., methyl, ethyl, iso-propyl, tert-butyl, n-octyl, n-decyl, n-hexadecyl, cyclopropyl, cyclopentyl, cyclohexyl), alkenyl group (preferably $C_{2-20}$, more preferably $C_{2-12}$, particularly $C_{2-8}$ alkenyl group, e.g., vinyl, allyl, 2-butenyl, 3-pentenyl), alkinyl group (preferably $C_{2-20}$, more preferably $C_{2-12}$, particularly $C_{2-8}$ alkinyl group, e.g., propargyl, 3-pentinyl), aryl group (preferably $C_{6-30}$, more preferably $C_{6-20}$, particularly $C_{6-12}$ aryl group, e.g., phenyl, p-methylphenyl, naphthyl), acyl group (preferably $C_{1-20}$, more preferably $C_{1-6}$, particularly $C_{1-12}$ acyl group, e.g. acetyl, benzoyl, formyl, pivaloyl), alkoxycarbonyl group (preferably $C_{2-20}$, more preferably $C_{2-16}$, particularly $C_{2-12}$ alkoxycarbonyl group, e.g., methoxycarbonyl, ethoxycarbonyl), aryloxy carbonyl group (preferably $C_{7-20}$, more preferably $C_{7-16}$, particularly $C_{7-10}$ aryloxycarbonyl group, e.g., phenyloxy carbonyl), sulfamoyl group (preferably $C_{0-20}$, more preferably $C_{0-16}$, particularly $C_{0-12}$ sulfamoyl group, e.g., sulfamoyl, methylsulfamoyl, dimethylsulfamoyl, phenylsulfamoyl), carbamoyl group (preferably $C_{1-20}$, more preferably $C_{1-16}$, particularly $C_{1-12}$ carbamoyl group, e.g., carbamoyl, methylcarbamoyl, diethylcarbamoyl, phenylcarbamoyl), sulfonyl group (preferably $C_{1-20}$, more preferably $C_{1-16}$, particularly $C_{1-12}$ sulfonyl group, e.g., mesyl, tosyl), sulfinyl group (preferably $C_{1-20}$, more preferably $C_{1-16}$, particularly $C_{1-12}$ sulfinyl group, e.g., methanesulfinyl, benzenesulfinyl), and heterocyclic group (preferably $C_{1-20}$, more preferably $C_{1-12}$ heterocyclic group having nitrogen atom, oxygen atom or sulfur atom as hetero atoms, e.g., imidazolyl, pyridyl, quinolyl, furyl, piperidyl, morpholino, benzoxazolyl, benzimidazolyl, benzthiazolyl). Preferred among these substituents are alkyl group, alkenyl group, aralkyl group, aryl group, acyl group, and heterocyclic group. Even more preferred among these substituents are alkyl group, aryl group, and aromatic heterocyclic group.

Preferred among the substituents represented by $R_{1a1}$, $R_{1b1}$, $R_{1c1}$, $R_{1c2}$, $R_{1d1}$, $R_{1d2}$, $R_{1e1}$ and $R_{1e2}$ are hydrogen atom, alkyl group, alkenyl group, aryl group, alkoxycarbonyl group, cyano group, and aromatic heterocyclic group.

Preferred among the substituents represented by $R_{1a2}$, $R_{1b2}$, $R_{1c3}$, $R_{1d3}$, $R_{1e3}$, $R_{1f1}$ and $R_{1f2}$ are hydrogen atom, alkyl group, aryl group, and aromatic heterocyclic group.

Particularly preferred among the compounds represented by the formula (I) are those represented by the formulae (I-a) to (I-c).

Even more preferred among the compounds represented by the formula (II) are those represented by the following formulae (II-a) to (II-f):

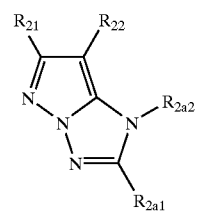

(II-a)

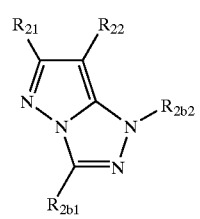

(II-b)

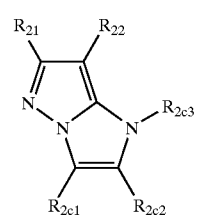

(II-c)

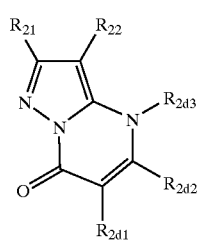

(II-d)

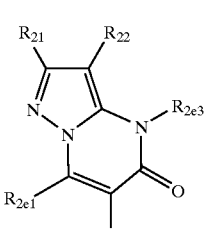

(II-e)

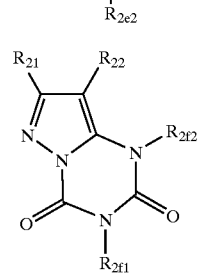

(II-f)

In the foregoing formulae (II-a) to (II-f), $R_{21}$ and $R_{22}$ are as defined in the formula (II), including preferred examples thereof. $R_{2a1}$, $R_{2a2}$, $R_{2b1}$, $R_{2b2}$, $R_{2c1}$, $R_{2c2}$, $R_{2c3}$, $R_{2d1}$, $R_{2d2}$, $R_{2d3}$, $R_{2e1}$, $R_{2e2}$, $R_{2e3}$, $R_{2f1}$ and $R_{2f2}$ each independently represents a hydrogen atom or substituent. Examples of the substituent represented by $R_{2a1}$, $R_{2b1}$, $R_{2c1}$, $R_{2c2}$, $R_{2d1}$, $R_{2d2}$, $R_{2e1}$ and $R_{2e2}$ include those represented by $R_{11}$, including preferred examples thereof. Examples of the substituent represented by $R_{2a2}$, $R_{2b2}$, $R_{2c3}$, $R_{2d3}$, $R_{2e3}$, $R_{2f1}$ and $R_{2f2}$ include those represented by $R_{1a2}$ in the formula (I-a), including preferred examples thereof.

Preferred among the substituents represented by $R_{2a2}$, $R_{2b2}$, $R_{2c3}$, $R_{2d3}$, $R_{2e3}$, $R_{2f1}$ and $R_{2f2}$ are hydrogen atom, alkyl group, aryl group, and aromatic heterocyclic group.

Particularly preferred among the compounds represented by the formula (II) are those represented by the formulae (II-a) to (II-c).

Even more preferred among the compounds represented by the formula (III) are those represented by the following formula (III-a):

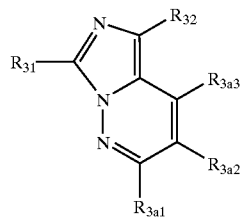

In the foregoing formula (III-a), $R_{31}$ and $R_{32}$ are as defined in the formula (III), including preferred examples thereof. $R_{3a1}$, $R_{3a2}$ and $R_{3a3}$ each independently represents a hydrogen atom or substituent. Examples of the substituent represented by $R_{3a1}$, $R_{3a2}$ and $R_{3a3}$ include those represented by $R_{11}$, including preferred examples thereof.

Even more preferred among the compounds represented by the formula (IV) are those represented by the formulae (IV-a) to (IV-e):

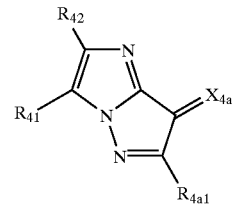

(IV-a)

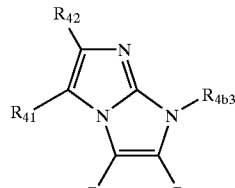

(IV-b)

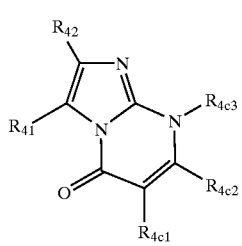

(IV-c)

-continued

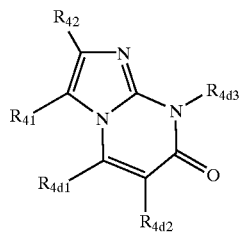
(IV-d)

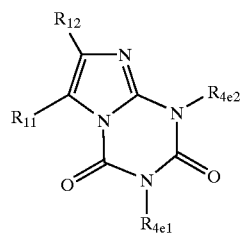
(IV-e)

In the foregoing formulae (IV-a) to (IV-e), $R_{41}$ and $R_{42}$ are as defined in the formula (IV), including preferred examples thereof. $R_{4a1}$, $R_{4b1}$, $R_{4b2}$, $R_{4b3}$, $R_{4c1}$, $R_{4c2}$, $R_{4c3}$, $R_{4d1}$, $R_{4d2}$, $R_{4d3}$, $R_{4e1}$ and $R_{4e2}$ each independently represents a hydrogen atom or substituent. Examples of the substituent represented by $R_{4a1}$, $R_{4b1}$, $R_{4b2}$, $R_{4c1}$, $R_{4c2}$, $R_{4d1}$ and $R_{4d2}$ include those represented by $R_{11}$, including preferred examples thereof. Examples of the substituent represented by $R_{2a2}$, $R_{4b3}$, $R_{4c3}$, $R_{4d3}$, $R_{4e1}$ and $R_{4e2}$ include those represented by $R_{1a2}$ in the formula (I-a), including preferred examples thereof.

Preferred among the substituents represented by $R_{4b3}$, $R_{4c3}$, $R_{4e1}$ and $R_{4e2}$ are hydrogen atom, alkyl group, aryl group, and aromatic heterocyclic group.

$X_{4a}$ represents $CR_{4a2}(R_{4a3})$ (in which $R_{4a2}$ and $R_{4a3}$ each independently represents a hydrogen atom or substituent (Examples of the substituent include those described above with reference to $R_{11}$, including preferred examples thereof)) or $NR_{4a4}$ (in which $R_{4a4}$ represents a hydrogen atom or a substituent such as those described above with reference to $R_{1a2}$ in the formula (I-a), preferably aryl group or aromatic heterocyclic group).

Particularly preferred among the compounds represented by the formula (IV) are those represented by the formulae (IV-a) and (IV-b).

Even more preferred among the compounds represented by the formula (V) are those represented by the following formulae (V-a) to (V-e):

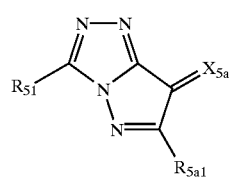
(V-a)

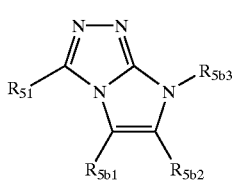
(V-b)

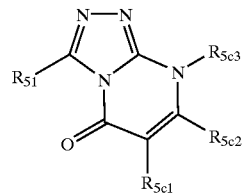
(V-c)

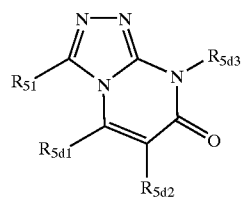
(V-d)

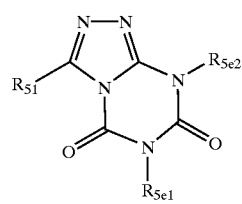
(V-e)

In the foregoing formulae (V-a) to (V-e), $R_{51}$ is as defined in the formula (V), including preferred examples thereof. $R_{5a1}$, $R_{5b1}$, $R_{5b2}$, $R_{5b3}$, $R_{5c1}$, $R_{5c2}$, $R_{5c3}$, $R_{5d1}$, $R_{5d2}$, $R_{5d3}$, $R_{5e1}$ and $R_{5e2}$ each independently represents a hydrogen atom or substituent. Examples of the substituent represented by $R_{5a1}$, $R_{5b1}$, $R_{5b2}$, $R_{5b3}$, $R_{5c1}$, $R_{5c2}$, $R_{5c3}$, $R_{5d1}$, $R_{5d2}$, $R_{5d3}$, $R_{5e1}$ and $R_{5e2}$ include those represented by $R_{11}$, including preferred examples thereof. Examples of the substituent represented by $R_{5b3}$, $R_{5c3}$, $R_{5d3}$, $R_{5e1}$ and $R_{5e2}$ include those represented by $R_{1a2}$ in the formula (I-a), including preferred examples thereof.

Preferred among the substituents represented by $R_{5b3}$, $R_{5c3}$, $R_{5d3}$, $R_{5e1}$ and $R_{5e2}$ are hydrogen atom, alkyl group, aryl group, and aromatic heterocyclic group. $X_{5a}$ represents $CR_{5a2}(R_{5a3})$ (in which $R_{5a2}$ and $R_{5a3}$ each independently represents a hydrogen atom or substituent (Examples of the substituent include those described above with reference to $R_{11}$, including preferred examples thereof)) or $NR_{5a4}$ (in which $R_{5a4}$ represents a hydrogen atom or a substituent such as those described above with reference to $R_{1a2}$ in the formula (I-a), preferably aryl group or aromatic heterocyclic group).

Particularly preferred among the compounds represented by the formula (V) are those represented by the formula (V-a) and (V-b).

Even more preferred among the compounds represented by the formula (VI) are those represented by the following formula (VI-a):

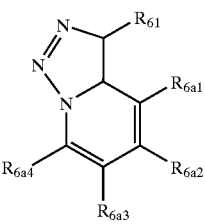
(VI-a)

In the foregoing formula (VI-a), $R_{61}$ is as defined in the formula (VI), including preferred examples thereof. $R_{6a1}$, $R_{6a2}$, $R_{6a3}$ and $R_{6a4}$ each independently represents a hydrogen atom or substituent. Examples of the substituent represented by $R_{6a1}$, $R_{6a2}$, $R_{6a3}$ and $R_{6a4}$ include those represented by $R_{11}$, including preferred examples thereof.

Even more preferred among the compounds represented by the formula (VII) are those represented by the following formulae (VII-a) to (VII-d):

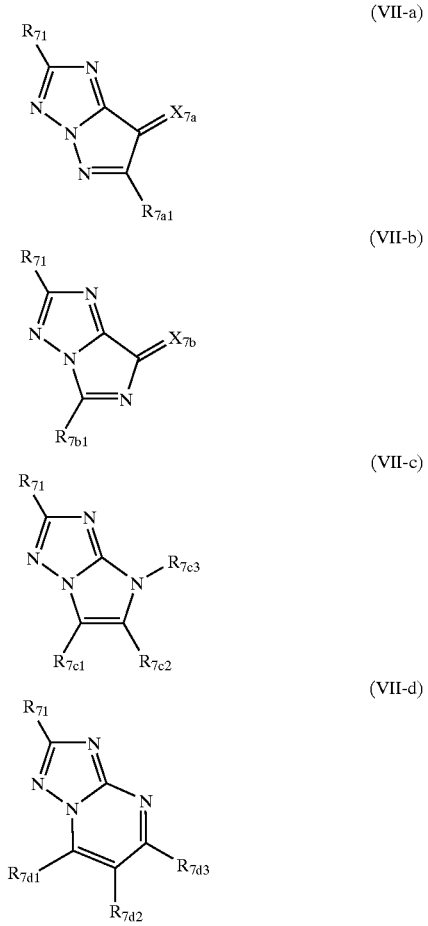

In the foregoing formulae (VII-a) to (VII-d), $R_{71}$ is as defined in the formula (VII), including preferred examples thereof. $R_{7a1}$, $R_{7b1}$, $R_{7c1}$, $R_{7c2}$, $R_{7c3}$, $R_{7d1}$, $R_{7d2}$ and $R_{7d3}$ each independently represents a hydrogen atom or substituent. Examples of the substituent represented by $R_{7a1}$, $R_{7b1}$, $R_{7c1}$, $R_{7c2}$, $R_{7c3}$, $R_{7d1}$, $R_{7d2}$ and $R_{7d3}$ include those represented by $R_{11}$, including preferred examples thereof. $R_{7c3}$ has the same meaning as $R_{1a2}$ in the formula (I-a), including preferred examples thereof. $X_{7a}$ and $X_{7b}$ each independently represents $CR_{7a2}(R_{7a3})$ (in which $R_{7a2}$ and $R_{7a3}$ each independently represents a hydrogen atom or substituent (Examples of the substituent include those described above with reference to $R_{11}$, including preferred examples thereof)) or $NR_{7a4}$ (in which $R_{7a4}$ represents a hydrogen atom or a substituent such as those described above with reference to $R_{1a2}$ in the formula (I-a), preferably aryl group or aromatic heterocyclic group).

The heterocyclic compound produced by the condensation of 5- or 6-membered ring with 5- to 7-membered ring of the present invention may be a low molecular compound or a high molecular compound having a residue connected to polymer main chain (preferably having a weight-average molecular weight of from 1,000 to 5,000,000, more preferably from 5,000 to 2,000,000, particularly from 10,000 to 1,000,000) or a high molecular compound having a compound of the present invention in its main chain (preferably having a weight-average molecular weight of from 1,000 to 5,000,000, more preferably from 5,000 to 2,000,000, particularly from 1,000 to 1,000,000). If the heterocyclic compound is a high molecular compound, the high molecular compound may be a homopolymer or a copolymer with other monomers. The compound to be used herein is preferably a low molecular compound. The compounds represented by the foregoing formulae are in the form of canonical structure for convenience but may be in the form of tautomer.

Specific examples of the compound of the present invention will be given below, but the present invention is not limited thereto.

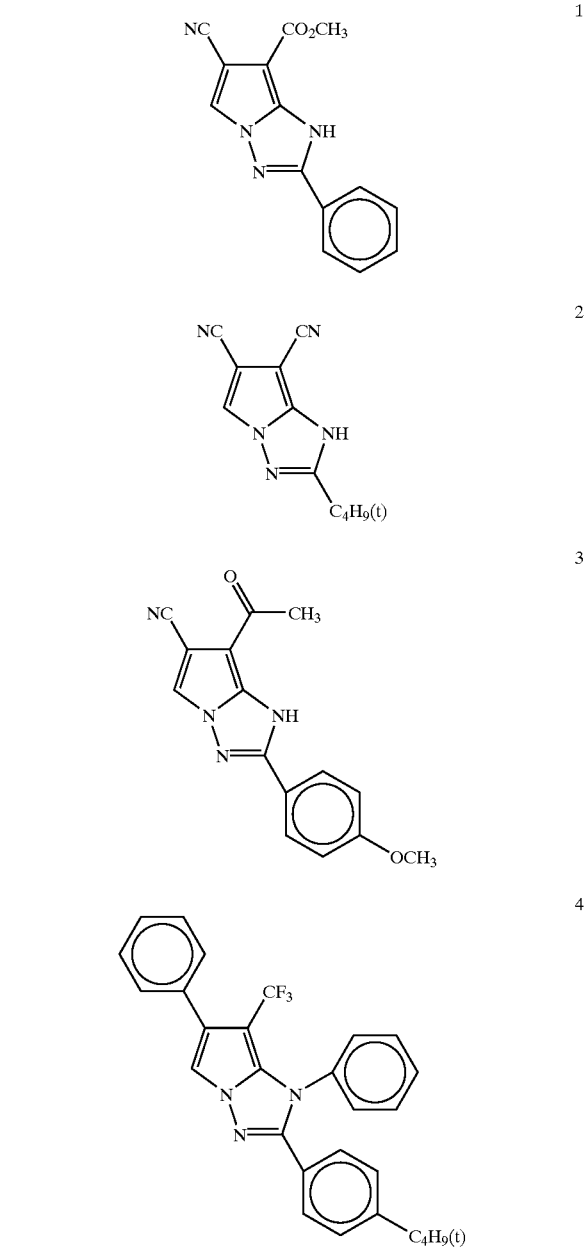

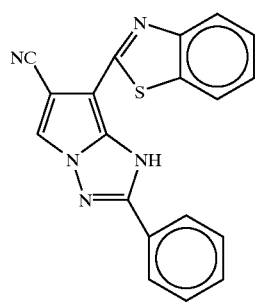
5
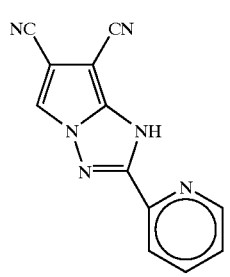
6
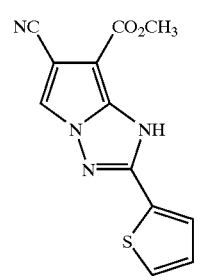
7
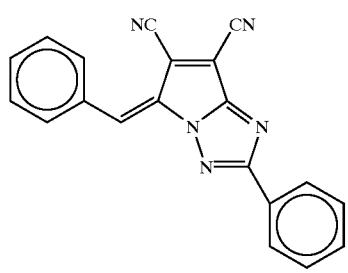
8
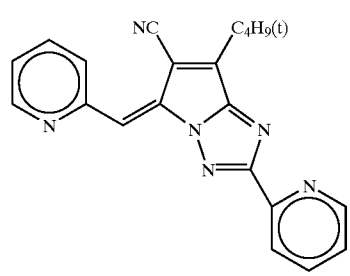
9
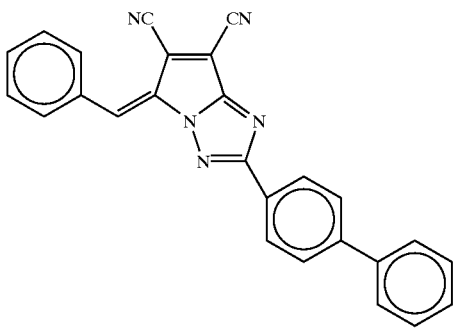
10
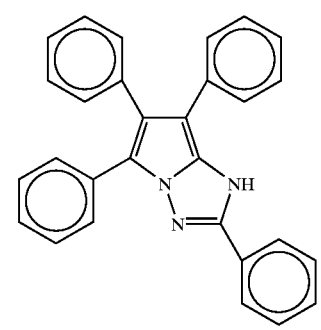
11
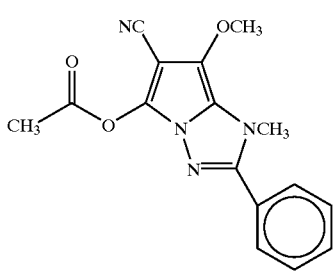
12
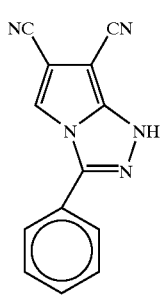
13
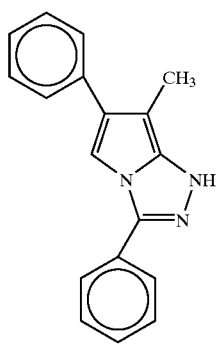
14

-continued
15
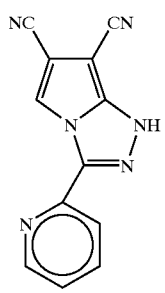
16
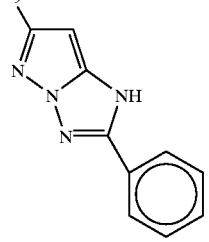
17
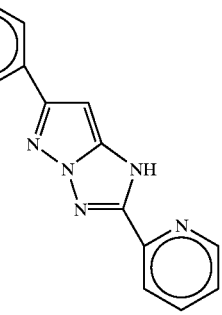
18
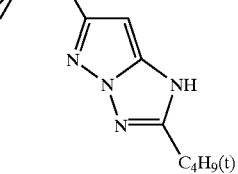
19
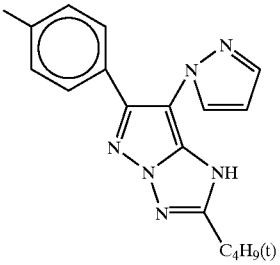
-continued
20
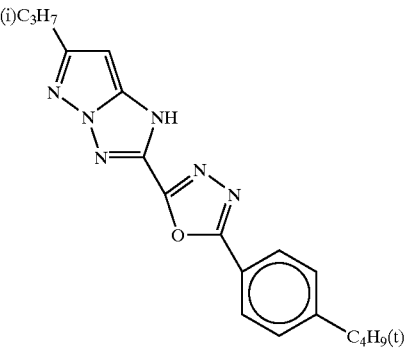
21
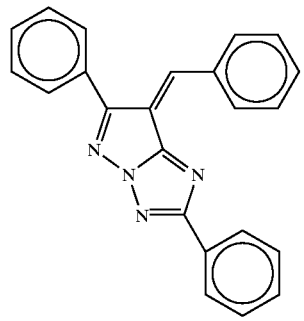
22
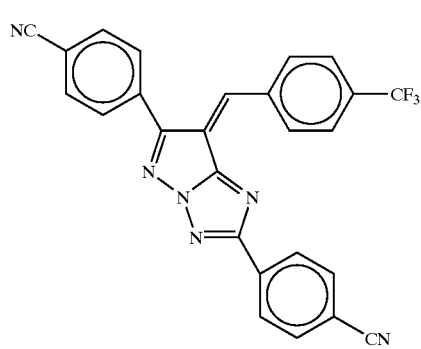
23
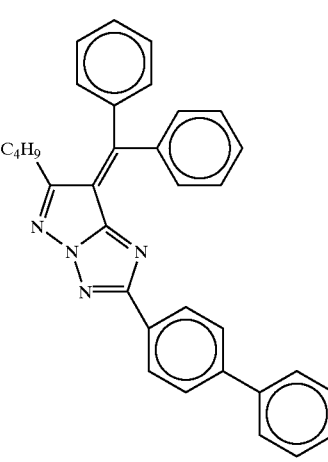

-continued
24
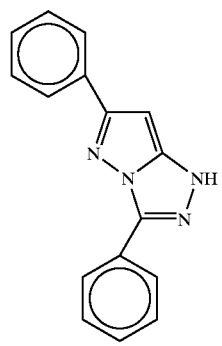
25
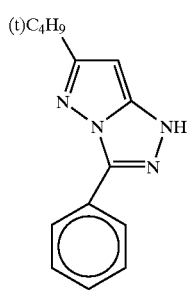
26
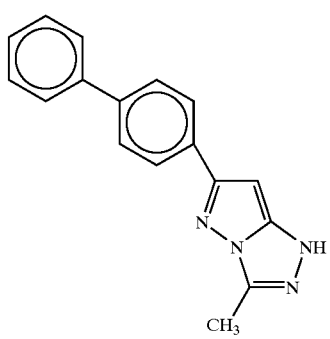
27
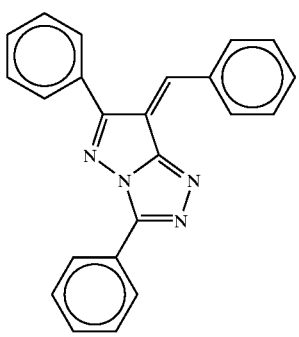
28
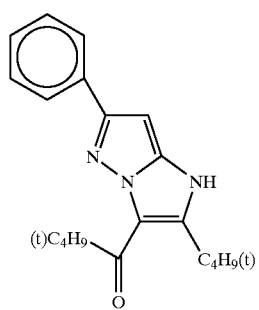
-continued
29
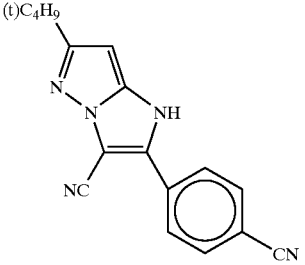
30
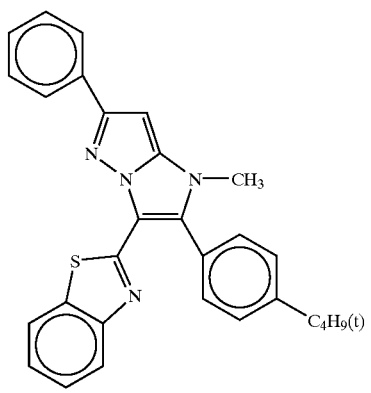
31
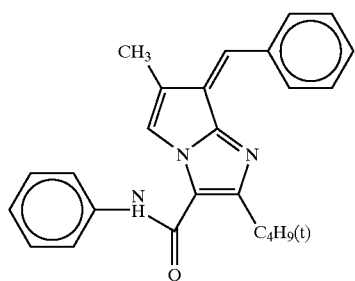
32
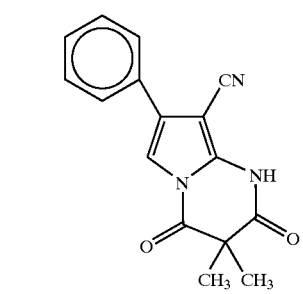
33
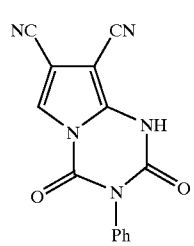

34
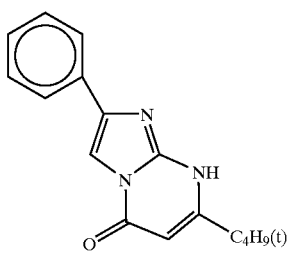
35
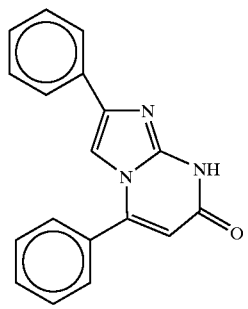
36
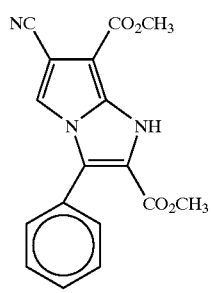
37
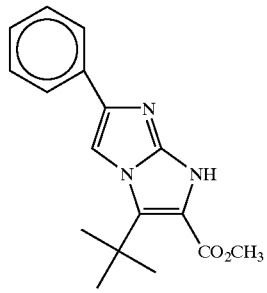
38
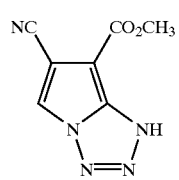
39
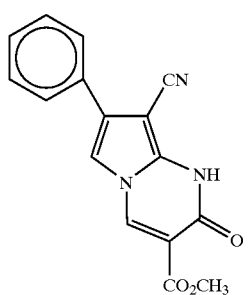
40
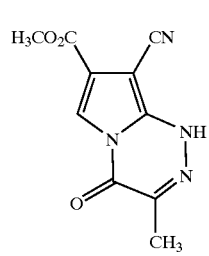
41
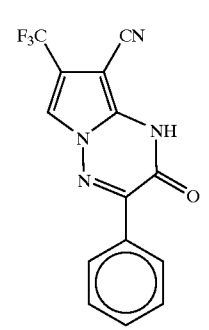
42
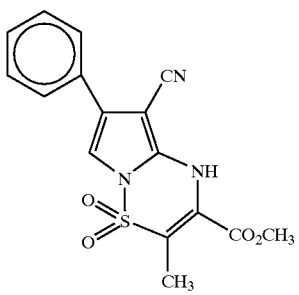
43
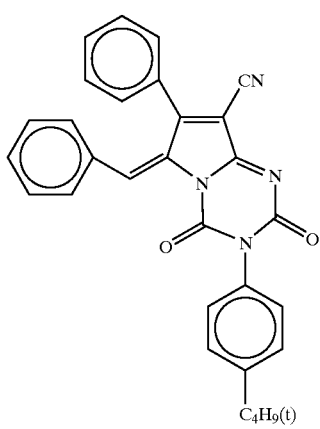
44
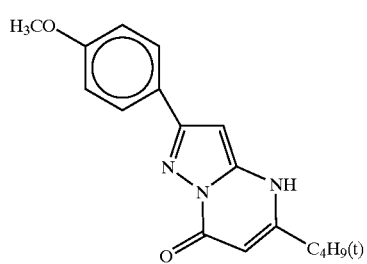

-continued
45
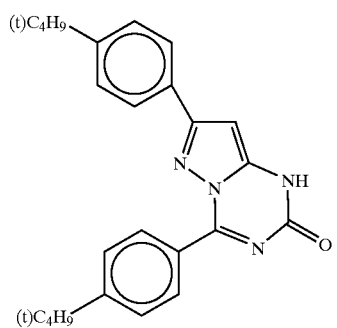
46
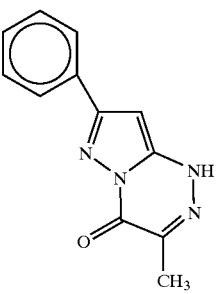
47
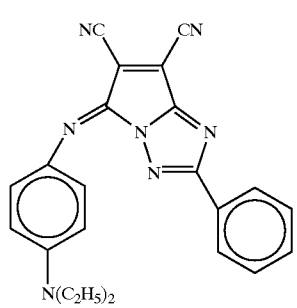
48
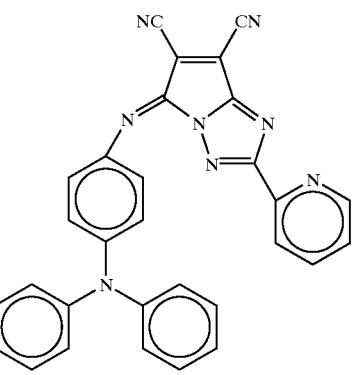
49
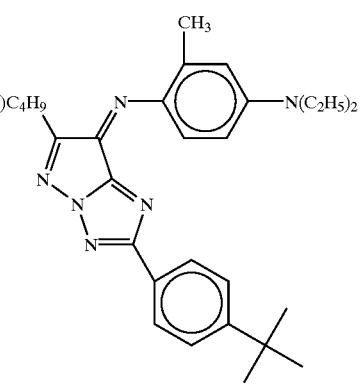
-continued
50
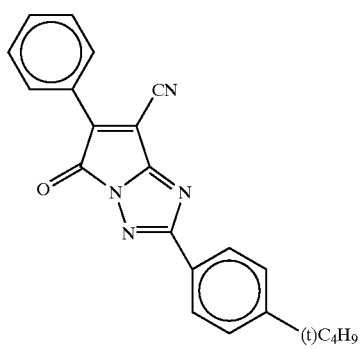
51
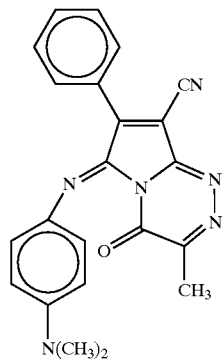
52
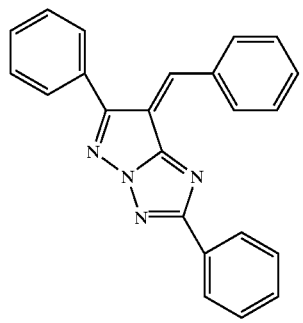
53
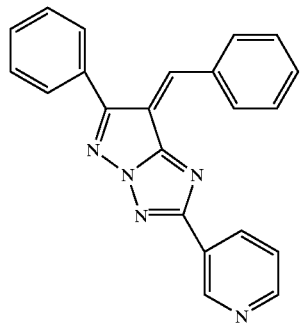

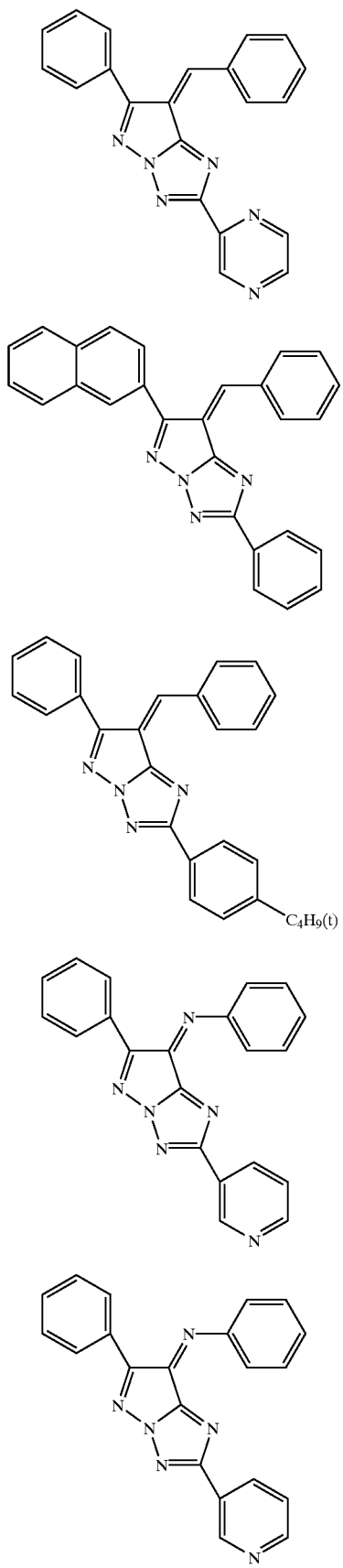
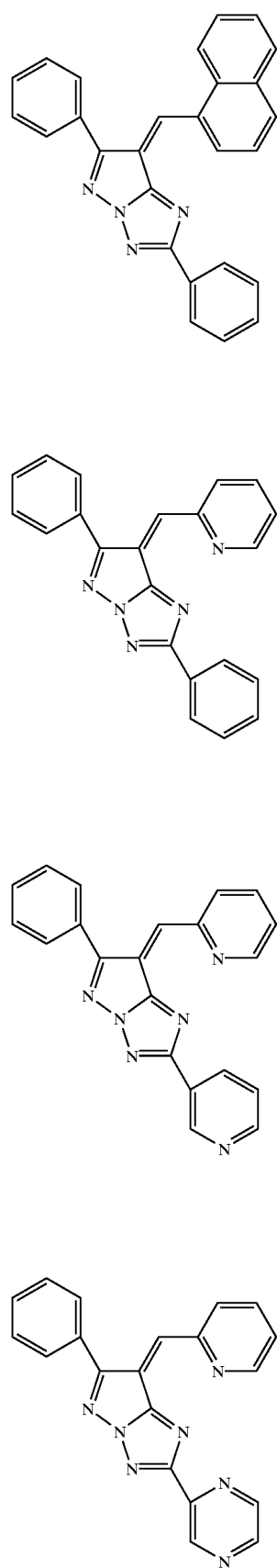

63
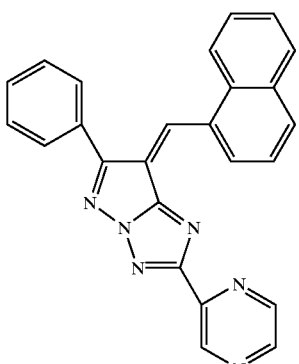
64
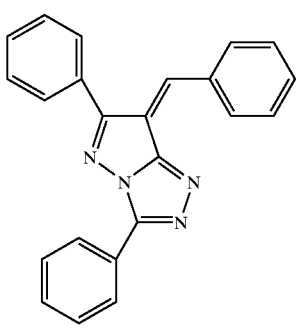
65
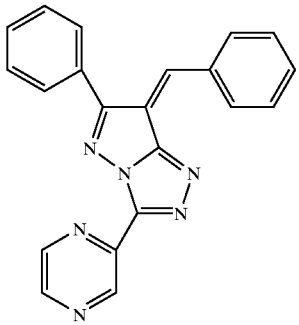
66
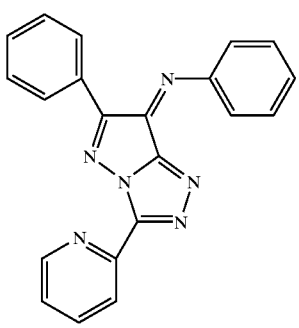
67
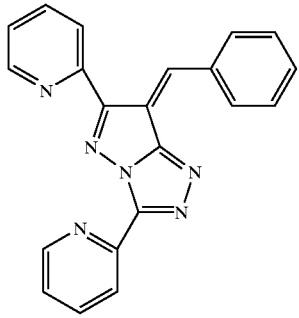
68
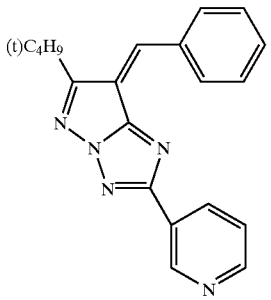
69
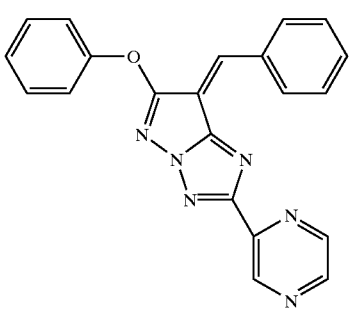
70
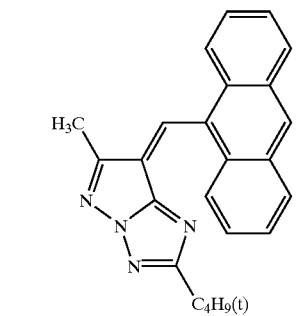
71

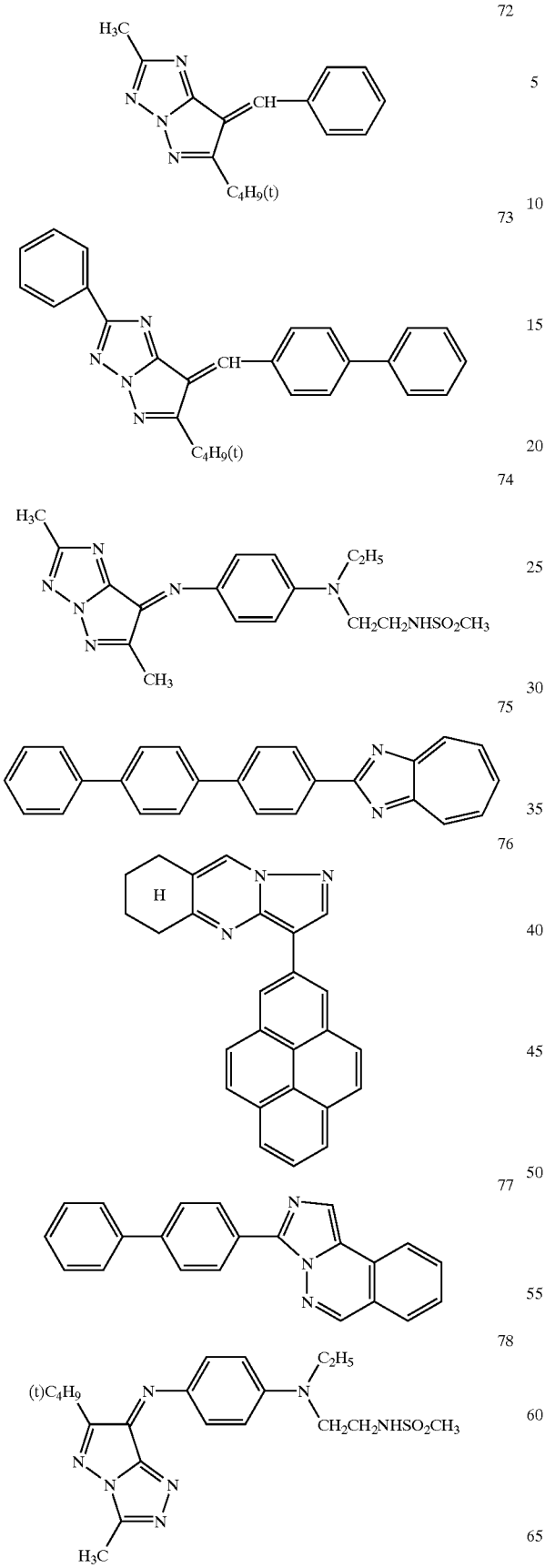

-continued

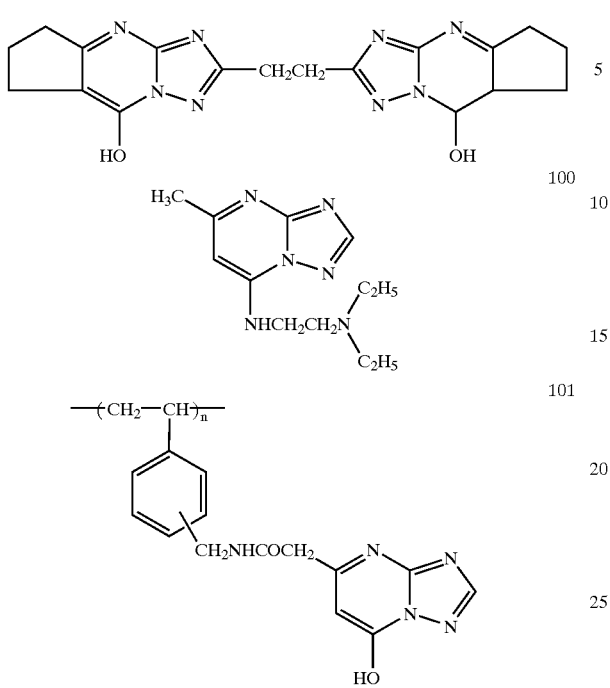
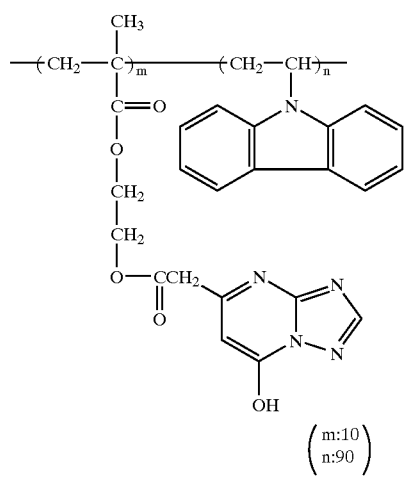
(Weight-average molecular weight: approx. 15,000 in polystyrene equivalence)
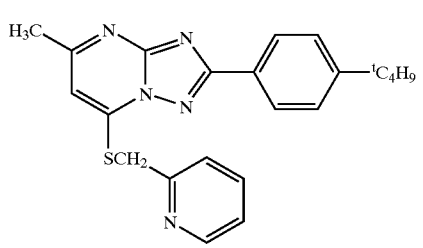
(Weight-average molecular weight: approx. 12,000 in Polystyrene equivalence)
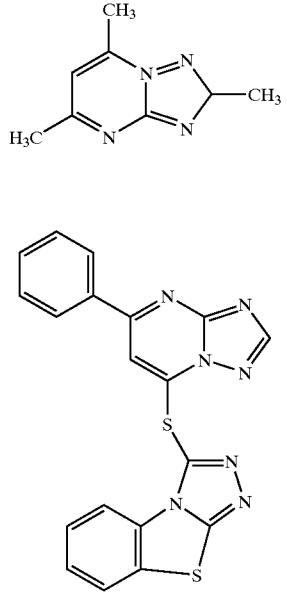
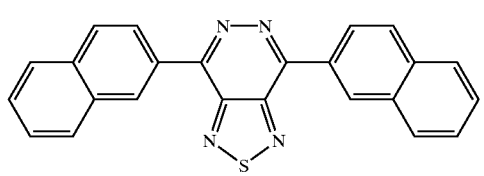
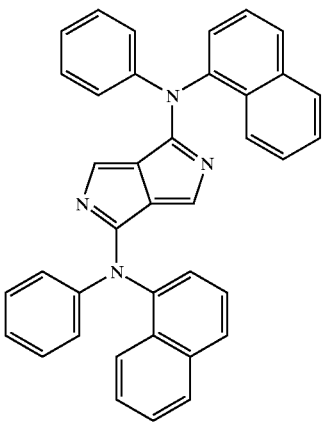
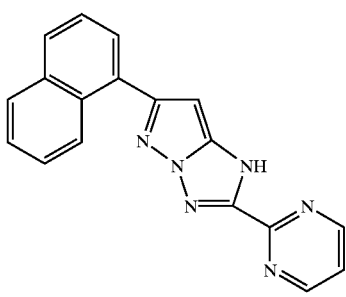

109 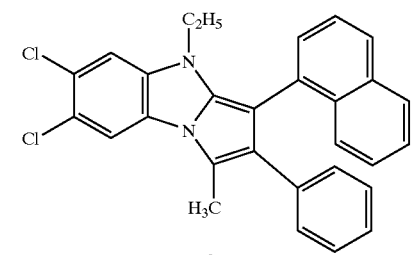

110 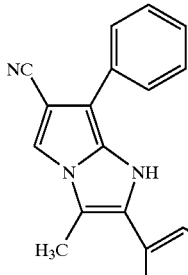

111 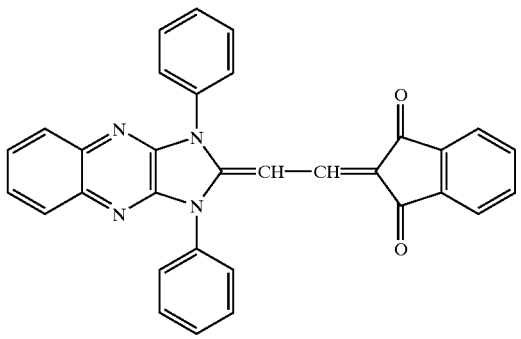

112 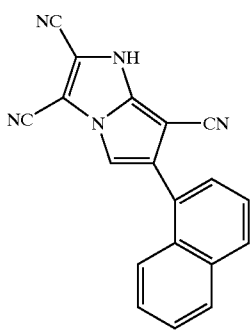

113 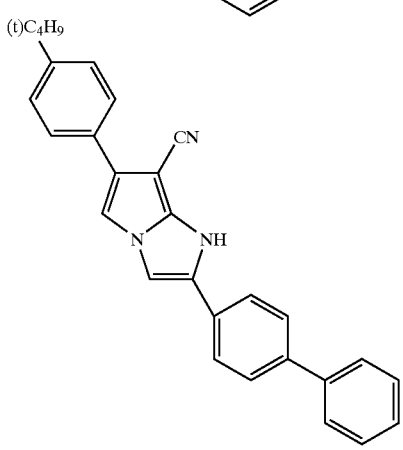

114 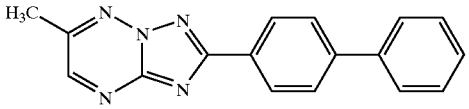

115 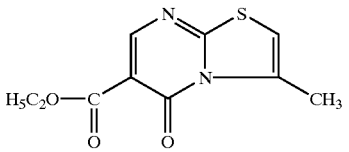

116 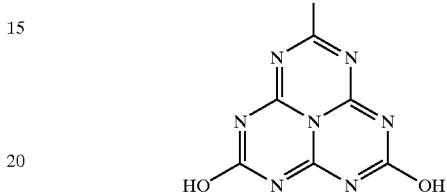

117 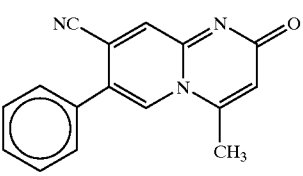

The foregoing compounds may be in the form of tautomer.

The compound of the present invention can be synthesized by various synthesis methods. For the details of these synthesis methods, reference can be made to Alan R. Katritzky, Charles W. Rees, "COMPREHENSIVE HETEROCYCLIC CHEMISTRY", JP-A-4-174204, and JP-A-5-313.

The light-emitting element of the present invention has a light-emitting layer or a plurality of organic compound thin layers containing a light-emitting layer formed between a pair of electrodes, i.e., positive electrode and negative electrode. The light-emitting element of the present invention may have a positive hole injection layer, a positive hole transporting layer, an electron injection layer, an electron transporting layer, a protective layer, etc. besides the light-emitting layer. These layers may each have other functions. The various layers may each be formed by various materials.

The material of the present invention may be added to any layer of the light-emitting element. Particularly, the material of the present invention is preferably added to a light-emitting layer and/or an electron injection/transporting layer.

The positive electrode acts to supply positive holes into the positive hole injection layer, positive transporting layer, light-emitting layer, etc. As the positive electrode there may be used a metal, alloy, metal oxide, electrically conductive compound or mixture thereof. Preferably, a material having a work function of not less than 4 eV is used. Specific examples of such a material include electrically conductive metal oxide such as tin oxide, zinc oxide, indium oxide and indium tin oxide (ITO), metal such as gold, silver, chromium and nickel, mixture or laminate of such a metal with such an electrically conductive metal oxide, electrically conductive inorganic material such as copper iodide and copper sulfide, electrically conductive organic material such as polyaniline, polythiophene and polypyrrole, and laminate of such an electrically conductive organic material with ITO. Preferred among these materials are electrically conductive metal oxides. Particularly preferred among these electrically conductive metal oxides is ITO from the standpoint of productivity, electrical conductivity, transparency, etc. The thickness of the positive electrode can be properly predetermined depending on the material used. In practice, however, the thickness of the positive electrode is preferably from 10 nm to 5 μm, more preferably from 50 nm to 1 μm, even more preferably from 100 nm to 500 nm.

The positive electrode is normally used in the form of layer formed on soda-lime glass, non-alkali glass, transparent resin substrate or the like. As the glass, if used, there is preferably used non-alkali glass to minimize the elution of ions therefrom. As soda-lime glass, if used, there is preferably used one coated with a barrier such as silica. The thickness of the substrate is not specifically limited so far as it is great enough to keep sufficient mechanical strength. In practice, however, the thickness of glass, if used, is normally not less than 0.2 mm, preferably not less than 0.7 mm.

For the preparation of the positive electrode, various methods may be employed depending on the material used. For example, if ITO is used, electron beam process, sputtering process, electrical resistance-heated vacuum evaporation method, chemical reaction process (sol-gel process, etc.) or process involving the application of indium tin oxide dispersion may be used.

The positive electrode can be cleaned or otherwise treated to lower the driving voltage of element or enhance the percent light emission. For example, if ITO is used, UV-ozone treatment is effective.

The negative electrode acts to supply electron into the electron injection layer, electron transporting layer, light-emitting layer, etc. The negative electrode material may be selected taking into account the adhesivity to the layer adjacent to the negative electrode such as electron injection layer, electron transporting layer and light-emitting layer, ionization potential, stability, etc. As the negative electrode material there may be used a metal, alloy, metal oxide, electrically conductive compound or mixture thereof. Specific examples of such a material include alkali metal (e.g., Li, Na, K), fluoride thereof, alkaline earth metal (e.g., Mg, Ca), fluoride thereof, gold, silver, lead, aluminum, sodium-potassium alloy, mixture thereof, lithium-aluminum alloy, mixture thereof, magnesium-silver alloy, mixture thereof, and rare earth metal such as indium and ytterbium. Preferably, a material having a work function of not more than 4 eV is used. More preferably, aluminum, lithium-aluminum alloy, mixture thereof, magnesium-silver alloy, mixture thereof, etc. are used. The thickness of the negative electrode may be properly predetermined depending on the material used. In practice, however, it is preferably from 10 nm to 5 μm, more preferably from 50 nm to 1 μm, even more preferably from 100 nm to 1 μm.

For the preparation of negative electrode, electron beam process, sputtering process, electrical resistance-heated vacuum evaporation process or coating process may be employed. A metal may be singly vacuum-evaporated. Alternatively, two or more components may be vacuum-evaporated at the same time. Further, a plurality of metals may be vacuum-evaporated at the same time to form an alloy electrode. Moreover, an alloy which has previously been prepared may be vacuum-evaporated.

The sheet resistivity of the positive electrode and negative electrode are preferably as low as not higher than hundreds of $\Omega/\square$.

As the material of light-emitting layer there may be used any suitable material so far as it can form a layer capable of receiving positive holes from the positive electrode or positive hole injection layer and positive hole transporting layer as well as receiving electron from the negative electrode or electron injection layer and electron transporting layer during the application of electric field and moving charge thus injected and providing a site for reconnection of positive hole and electron to emit light. Preferably, the light-emitting layer has a compound of the present invention incorporated therein. Light-emitting materials other than the compound of the present invention may be used. Examples of light-emitting materials employable herein include various metal complexes such as metal complex and rare earth complex of benzoxazole derivative, benzimidazole derivative, benzothiazole derivative, styrylbenzene derivative, polyphenyl derivative, diphenylbutadiene derivative, tetraphenylbutadiene derivative, naphthalimide derivative, coumarin derivative, perylene derivative, perynone derivative, oxadiazole derivative, aldazine derivative, pyralidine derivative, cyclopentadiene derivative, bisstyrylanthracene derivative, quinacridone derivative, pyrrolopyridine derivative, thiadiazolopyridine derivative, cyclopentadiene derivative, styrylamine derivative, aromatic dimethylidene compound and 8-quinolinol derivative, and polymer compounds such as polythiophene, polyphenylene and polyphenylene vinylene. The thickness of the light-emitting layer is not specifically limited. In practice, however, it is preferably from 1 nm to 5 μm, more preferably from 5 nm to 1 μm, even more preferably from 10 nm to 500 nm.

The process for the formation of the light-emitting layer is not specifically limited. In practice, however, electrical resistance-heated vacuum evaporation process, electron beam process, sputtering process, molecular lamination process, coating process (spin coating process, cast process, dip coating process, etc.), LB process, etc. may be used. Preferred among these processes are electrical resistance-heated vacuum evaporation process and coating process.

As the material of positive hole injection layer and positive hole transporting layer there may be used any suitable material so far as it is capable of injecting positive holes from the positive electrode, transporting positive holes or giving a barrier against electron injected from the negative electrode.

Specific examples of such a material include electrically conductive high molecular oligomers such as carbazole derivative, triazole derivative, oxazole derivative, oxadiazole derivative, imidazole derivative, polyarylalkane derivative, pyrazoline derivative, pyrazolone derivative, phenylenediamine derivative, arylamine derivative, amino-substituted chalcone derivative, styrylanthracene derivative, fluorenone derivative, hydrazone derivative, stilbene derivative, silazane derivative, aromatic tertiary amine compound, styrylamine compound, aromatic dimethylidene compound, porphyrin compound, polysilane compound, poly(N-vinylcarbazole) derivative, aniline copolymer, thiophene oligomer and polythiophene. The thickness of the positive hole injection layer and positive hole transporting layer is not specifically limited. In practice, however, it is preferably from 1 nm to 5 μm, more preferably from 5 nm to 1 μm, even more preferably from 10 nm to 500 nm. The positive hole injection layer and positive hole transporting layer each may have a single-layer structure made of one or more of the foregoing materials or a multi-layer structure made of a plurality of layers having the same or different compositions.

For the formation of positive hole injection layer and positive hole transporting layer, vacuum evaporation process, LB process or process involving coating of a solution or dispersion of the foregoing positive hole transporting material (spin coating process, cast process, dip coating process, etc.) may be used. For the coating process, if used, the positive hole transporting material may be dissolved or dispersed with a resin component. Examples of the resin component employable herein include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin, and silicone resin.

As the material of electron injection layer and electron transporting layer there may be used any suitable material so far as it is capable of injecting electron from the negative electrode, transporting electron or giving a barrier against positive holes injected from the positive electrode. Specific examples of such a material include various metal complexes such as metal complex of triazole derivative, oxazole derivative, oxadiazole derivative, fluorenone derivative, anthraquinodimethane derivative, anthrone derivative, diphenylquinone derivative, thiopyrandioxide derivative, carbodiimide derivative, fluoreriylidenemethane derivative, distyrylpyrazine derivative, heterocyclic tetracarboxylic anhydride (e.g., naphthaleneperylene), phthalocyanine derivative and 8-quinolinol derivative and metal complex having metal phthalocyanine, benzoxazole or benzothiazole as a ligand. The thickness of the electron injection layer and electron transporting layer is not specifically limited. In practice, however, it is preferably from 1 nm to 5 $\mu$m, more preferably from 5 nm to 1 $\mu$m, even more preferably from 10 nm to 500 nm. The electron injection layer and electron transporting layer each may have a single-layer structure made of one or more of the foregoing materials or a multi-layer structure having a plurality of layers made of the same or different compositions.

For the formation of electron injection layer and electron transporting layer, vacuum evaporation process, LB process or process involving coating of a solution or dispersion of the foregoing electron injecting/transporting material (spin coating process, cast process, dip coating process, etc.) may be used. For the coating process, if used, the electron injecting/transporting material may be dissolved or dispersed with a resin component. Examples of the resin component employable herein include those exemplified above with reference to the positive hole injection layer and transporting layer.

As the material of protective layer there may be used any suitable material so far as it is capable of inhibiting the entrance of any material which accelerates the deterioration of element such as water content and oxygen into the element. Specific examples of such a protective material include metal such as In, Sn, Pb, Au, Cu, Ag, Al, Ti and Ni, metal oxide such as Mgo, SiO, $SiO_2$, $Al_2O_3$, GeO, NiO, CaO, BaO, $Fe_2O_3$, $Y_2O_3$ and $TiO_2$, metal fluoride such as $MgF_2$, LiF, $AlF_3$ and $CaF_2$, copolymer of polyethylene, polypropylene, polymethyl methacrylate, polyimide, polyurea, polytetrafluoroethylene, polychlorotrifluoroethylene, polydichlorodifluoroethylene and chlorotrifluoroethylene with dichlorodifluoroethylene, copolymer obtained by the copolymerization of tetrafluoroethylene with a monomer mixture containing at least one comonomer, fluorine-containing copolymer having a cyclic structure in copolymer main chain, water-absorbing material having a water absorption of not less than 1%, and moisture-resistant material having a water absorption of not more than 0.1%.

The process for the formation of the protective layer is not specifically limited. For example, vacuum evaporation process, sputtering process, reactive sputtering process, MBE (molecular beam epitaxy) process, cluster ion beam process, ion plating process, plasma polymerization process (high frequency-excited ion plating process), plasma CVD process, laser CVD process, hot CVD process, gas source CVD process, and coating process may be employed.

The present invention will be further described in the following examples, but the present invention should not be construed as being limited thereto.

EXAMPLE 1

An ITO layer having a thickness of 150 nm formed on a glass substrate having a size of 25 mm×25 mm×0.7 mm (produced by Tokyo Sanyo Shinku K.K.) was prepared as a transparent support. The transparent support was etched, and then washed. A solution of 40 mg of a poly(N-vinylcarbazole), 0.5 mg of 1, 1, 4, 4-tetraphenylbutadiene and 12 mg of a compound set forth in Table 1 below in 3 ml of 1, 2-dichloroethane was then applied to the ITO substrate thus washed by spin coating process. The thickness of the organic thin film thus produced was about 110 nm. Magnesium and silver (10:1) were then co-evaporated on the organic thin film to a thickness of 50 nm with a patterned mask (light-emitting area: 5 mm×5 mm) provided thereon in an evaporator. Silver was then evaporated to a thickness of 150 nm.

Using a Type 2400 source measure unit produced by Toyo Technica Co., Ltd., a constant dc voltage was applied to the light-emitting element to cause emission of light. The luminance of light thus emitted was measured by means of a Type BM-8 produced by TOPCON CORP. The wavelength of light thus emitted was measured by means of a Type PMA-11 spectral analyzer produced by Hamamatsu Photonics K.K. After 20 hours of storage at 30° C. and 40%RH, the specimen was then visually observed for occurrence of dark spots. The results are set forth in Table 1.

TABLE 1

| Sample No. | Compound No. | Lowest driving voltage (V) | Wavelength of light emitted $\lambda_{max}$ (nm) | Color of light emitted | Maximum luminescence (cd/m$^2$) | Occurrence of Dark spots occurred | Remarks |
| --- | --- | --- | --- | --- | --- | --- | --- |
| 101 | Comparative Compound 1 | 14 | 482 | Blue | 31 | Yes | Comparative example |
| 102 | Comparative Compound 2 | 12 | 515 | Green | 620 | No | Comparative example |
| 103 | Exemplary Compound 2 | 7 | 478 | Blue | 830 | No | Present Invention |
| 104 | Exemplary Compound 5 | 8 | 480 | Blue | 810 | No | " |

TABLE 1-continued

| Sample No. | Compound No. | Lowest driving voltage (V) | Wavelength of light emitted $\lambda_{max}$ (nm) | Color of light emitted | Maximum luminescence (cd/m$^2$) | Occurrence of Dark spots occurred | Remarks |
|---|---|---|---|---|---|---|---|
| 105 | Exemplary Compound 10 | 8 | 481 | Blue | 764 | No | " |
| 106 | Exemplary Compound 15 | 7 | 482 | Blue | 770 | No | " |
| 107 | Exemplary Compound 20 | 7 | 481 | Blue | 698 | No | " |
| 108 | Exemplary Compound 23 | 8 | 482 | Blue | 667 | No | " |
| 109 | Exemplary Compound 48 | 8 | 484 | Blue | 635 | No | " |
| 110 | Exemplary Compound 56 | 7 | 480 | Blue | 776 | No | " |
| 111 | Exemplary Compound 66 | 9 | 480 | Blue | 589 | No | " |
| 112 | Exemplary Compound 80 | 8 | 482 | Blue | 616 | No | " |
| 113 | Exemplary Compound 81 | 8 | 483 | Blue | 610 | No | " |
| 114 | Exemplary Compound 98 | 7 | 482 | Blue | 605 | No | " |
| 115 | Exemplary Compound 108 | 8 | 481 | Blue | 683 | No | " |

Comparative Compound 1 (PBD)

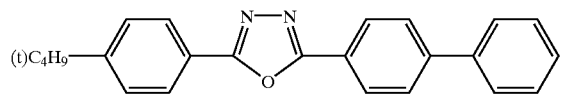

Comparative Compound 2 (Alq)

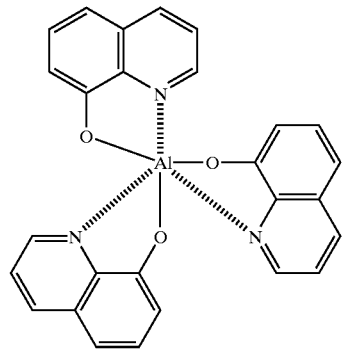

It can be seen in Table 1 that the elements comprising compounds of the present invention can be driven at a low voltage and emit light having a high luminescence even if prepared by coating process, which normally provides a low luminescence, as compared with the comparative compounds. The elements of the present invention exhibit a fair planar light emission while the element comprising Comparative Compound 1 (PBD) shows remarkable occurrence of dark spots. It can further be seen that the elements comprising compounds of the present invention exhibit a high blue purity and hence can act as a host material for emission of blue light while the element comprising Comparative Compound 2 (Alq) shows emission of light mainly derived from Alq and having a lowered blue purity and hence cannot effectively act as a host material for emission of blue light.

EXAMPLE 2

An ITO substrate was etched, and then washed in the same manner as in Example 1. Copper phthalocyanine and TPD (N,N'-bis(3-methylphenyl)-N,N'-diphenylbenzidine) were then evaporated on the ITO substrate to a thickness of 5 nm and 40 nm, respectively. Subsequently, coumarin 6 and a compound set forth in Table 2 were then co-evaporated on the ITO substrate at an evaporation rate of 0.04 A/sec. and 4 A/sec. to a total thickness of 60 nm. Subsequently, an Al—Li alloy having a Li concentration of 15 wt-% was evaporated on the ITO substrate at a rate of 5 A/sec. to a thickness of 200 nm. The sample was then evaluated in the same manner as in Example 1. The results are set forth in Table 2.

TABLE 2

| Sample No. | Compound No. | Lowest driving voltage (V) | Maximum luminescence (cm/m$^2$) | Occurrence of Dark spots | Remarks |
|---|---|---|---|---|---|
| 201 | Comparative Compound 1 | 11 | 530 | Yes | Comparative example |
| 202 | Comparative Compound 2 | 9 | 1,620 | No | Comparative example |
| 203 | Exemplary Compound 2 | 5 | 4,830 | No | Present invention |
| 204 | Exemplary Compound 5 | 6 | 3,810 | No | " |
| 205 | Exemplary Compound 10 | 6 | 2,764 | No | " |
| 206 | Exemplary Compound 15 | 5 | 3,770 | No | " |
| 207 | Exemplary Compound 20 | 5 | 2,698 | No | " |
| 208 | Exemplary Compound 23 | 6 | 2,667 | No | " |
| 209 | Exemplary Compound 48 | 6 | 2,635 | No | " |
| 210 | Exemplary Compound 56 | 5 | 2,776 | No | " |

Comparative Compounds 1 and 2 are the same as used in Example 1.

Coumarin 6

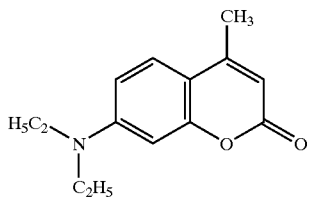

As can be seen in Table 2 that the elements comprising compounds of the present invention can emit light having a high luminescence and exhibit a good durability even if prepared by evaporation process as compared with those comprising comparative compounds.

EXAMPLE 3

A solution of 40 mg of a poly(N-vinylcarbazole), 12 mg of Exemplary Compound 108 of the present invention, 10 mg of 1, 1, 4, 4-tetraphenylbutadiene, 0.5 mg of DCM and 0.1 mg of Nile Red in 3 ml of 1, 2-dichloroethane was spin-coated on an ITO glass substrate which had been etched and washed in the same manner as in Example 1. Subsequently, a negative electrode was evaporated on the ITO glass substrate in the same manner as in Example 1.

A dc voltage was then applied to the element thus obtained with the ITO electrode as a positive electrode and an Mg:Ag electrode as a negative electrode to examine the light emitting properties thereof. As a result, white light (luminescence: 1,120 cd/m$^2$) where x and y are 0.35 and 0.37, respectively, on CIE chromaticity diagram was obtained at 15 V. It was thus found that the element is effective for emission of white light.

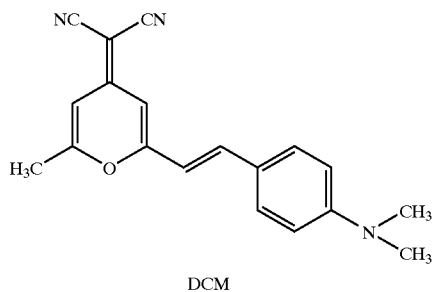

DCM

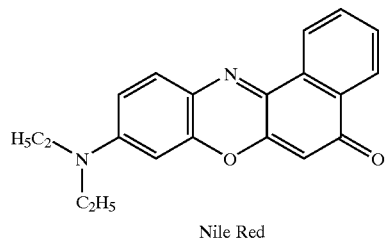

Nile Red

In accordance with the present invention, an element which can emit light having a high color purity at a high luminescence and a high efficiency and exhibits good light emitting properties even if prepared by coating process which normally provides a low luminescence can be prepared at a reduced cost. Further, the element thus obtained is excellent also in durability as compared with those comprising the conventional compounds.

While the invention has been described in detail and with reference to specific embodiments thereof, it will be apparent to one skilled in the art that various changes and modifications can be made therein without departing from the spirit and scope thereof.

What is claimed is:

1. An organic electroluminescence element comprising a light-emitting layer or a plurality of organic compound thin layers containing a light-emitting layer between a pair of electrodes, wherein at least one layer in the organic electroluminescence element comprises at least one heterocyclic compound represented by formula (I) to (VII).

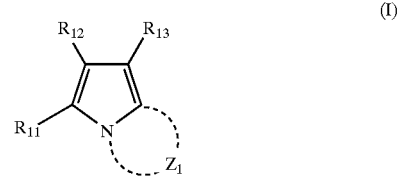

(I)

wherein $R_{11}$, $R_{12}$ and $R_{13}$ each independently represents a hydrogen atom or substituent; and $Z_1$ represents an atomic group required to form a imidazole, triazole, triazine, or pyrimidine ring,

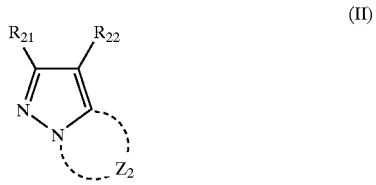

(II)

wherein $R_{21}$ and $R_{22}$ each independently represents a hydrogen atom or substituent; and $Z_2$ represents an atomic group required to form a 5- or 6-membered ring,

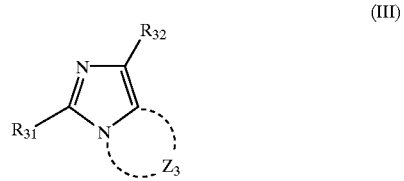

(III)

wherein $R_{31}$ and $R_{32}$ each independently represents a hydrogen atom or substituent; and $Z_3$ represents an atomic group required to form a 5- or 6-membered ring,

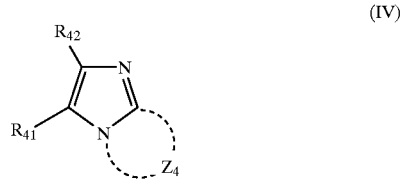

(IV)

wherein $R_{41}$ and $R_{42}$ each independently represents a hydrogen atom or substituent; and $Z_4$ represents an atomic group required to form a pyrrole, pyrazole, imidazole, triazole, thiazole, thiadiazole, oxazole, oxadiazole, triazine, pyrimidine, pyridine, pyrazine or pyridazine,

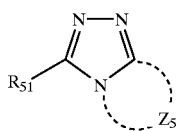
(V)

wherein $R_{51}$ represents a hydrogen atom or substituent; and $Z_5$ represents an atomic group required to form a 5- or 6-membered ring,

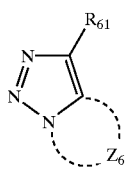
(VI)

wherein $R_{61}$ represents a hydrogen atom or substituent; and $Z_6$ represents an atomic group required to form a 5- or 6-membered ring,

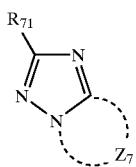
(VII)

wherein $R_{71}$ represents a hydrogen atom or substituent; and $Z_7$ represents an atomic group required to form a 5- or 6-membered ring.

2. The organic electroluminescence element according to claim 1, further comprising a polymer in at least one layer.

3. The organic electroluminescence element according to claim 1, wherein $Z_1$ represents an atomic group required to form a triazole.

4. The organic electroluminescence element according to claim 1, wherein $Z_2$ represents an atomic group required to form a pyrrole, pyrazole, imidazole, triazole, thiazole, thiadiazole, oxazole, oxadiazole, triazine, pyrimidine, pyridine, pyrazine or pyridazine.

5. The organic electroluminescence element according to claim 4, wherein $Z_2$ represents an atomic group required to form an imidazole, triazole, triazine or pyrimidine.

6. The organic electroluminescence element according to claim 1, wherein $Z_3$ represents an atomic group required to form a pyrrole, pyrazole, imidazole, triazole, thiazole, thiadiazole, oxazole, oxadiazole, triazine, pyrimidine, pyridine, pyrazine or pyridazine.

7. The organic electroluminescence element according to claim 6, wherein $Z_3$ represents an atomic group required to form a pyrrole, pyrazole, imidazole or triazole.

8. The organic electroluminescence element according to claim 1, wherein $Z_4$ represents an atomic group required to form a pyrrole, pyrazole, imidazole or triazole.

9. The organic electroluminescence element according to claim 1, wherein $Z_5$ represents an atomic group required to form a pyrrole, pyrazole, imidazole, triazole, thiazole, oxazole, oxadiazole, triazine, pyrimidine, pyridine, pyrazine or pyridazine.

10. The organic electroluminescence element according to claim 9, wherein $Z_5$ represents an atomic group to form a pyrrole, pyrazole, imidazole, pyrimidine, pyrazine or pyridazine.

11. The organic electroluminescence element according to claim 1, wherein $Z_6$ represents an atomic group required to form a pyrrole, imidazole, thiazole, oxazole, pyrimidine, pyridine or pyridazine.

12. The organic electroluminescence element according to claim 11, wherein $Z_6$ represents an atomic group required to form a pyrrole, imidazole, pyrimidine or pyridazine.

13. The organic electroluminescence element according to claim 1, wherein $Z_7$ an atomic group required to form a pyrrole, imidazole, thiazole, oxazole, pyrimidine, pyridine or pyridazine.

14. The organic electroluminescence element according to claim 13, wherein $Z_7$ represents an atomic group required to form a pyrrole, imidazole, pyrimidine or pyridazine.

* * * * *